United States Patent [19]

Gessner et al.

[11] Patent Number: 5,034,956
[45] Date of Patent: Jul. 23, 1991

[54] SEMICONDUCTOR LASER IN THE SYSTEM GAALINAS

[75] Inventors: Roland Gessner, Geretsried; Margit Beschorner, Assling; Manfred Druminski, Vaterstetten, all of Fed. Rep. of Germany

[73] Assignee: Siemens Aktiengesellschaft, Munich, Fed. Rep. of Germany

[21] Appl. No.: 430,319

[22] Filed: Nov. 2, 1989

[30] Foreign Application Priority Data

Nov. 9, 1988 [DE] Fed. Rep. of Germany ....... 3838016

[51] Int. Cl.$^5$ ................................................ H01S 3/19
[52] U.S. Cl. ......................................... 372/45; 357/4; 357/17
[58] Field of Search ................... 372/45, 43; 357/4, 17

[56] References Cited

U.S. PATENT DOCUMENTS

| | | | |
|---|---|---|---|
| 4,382,265 | 5/1983 | Pearsall | 351/16 |
| 4,430,740 | 2/1984 | Nuyen et al. | 372/45 |
| 4,441,187 | 4/1984 | Bouley et al. | 372/46 |
| 4,479,222 | 10/1984 | Hawrylo | 372/45 |
| 4,573,161 | 2/1986 | Sakai et al. | 372/45 |
| 4,599,728 | 7/1986 | Alavi et al. | 372/45 |
| 4,611,328 | 9/1986 | Liu et al. | 372/45 |

FOREIGN PATENT DOCUMENTS

0201930A2 5/1986 European Pat. Off. .
57-198681 12/1982 Japan .
62-54988 3/1987 Japan .

OTHER PUBLICATIONS

"Low Threshold Current . . . Ridge MQw Lasers with InP Cladding Layers", by Y. Kawamura et al, Electronic Letters, vol. 24, No. 10, May 12, 1988, pp. 637–638.
"Low Internal Loss Separate Confinement Heterostructure InGaAs/InGaAsP Quantum Well Laser", by U. Koren et al, Appl. Phys. Letter 51 (21), Nov. 23, 1987, pp. 1744–1746.
"Excellent Negative Differential Resistance of InAlAs/InGaAs Resonant Tunneling Barrier Structures Grown by MBE", by Tsuguo Inata et al, Japanese Journal of Applied Physics, vol. 25, No. 12, Dec. 1986, pp. L983–L985.
"New Current Injection . . . Double–Heterostructure Laser Grown by Molecular Beam Epitaxy", by W. T. Tsang et al, Appl. Phys. Letter 42 (11), Jun. 1, 1983, pp. 922–924.
"Si–Induced Disordering of . . . Multiquantum Well Structures", by Takeo Miyazawa, et al, Japanese Journal of Applied Physics, vol. 27, No. 9, Sep. 1988, pp. L1731–L1733.
"InGaAs/InGaAlAs/InAlAs/InP SCH–MQW Laser Diodes Grown by Molecular–Beam Epitaxy", by Y. Kawamura et al, Electronic Letters, May 24, 1984, vol. 20, No. 11, pp. 459–460.
"Optically Pumped . . . Double Heterostructure . . . As Lasers Grown by Molecular Beam Epitaxy" by K. Alavi et al, Appl. Phys. Letter 42 (3), Feb. 1, 1983, pp. 254–256.
"Room Temperature CW Operation of MBE–Grown GaInAs/AlInAs MQW Lasers In . . . Range", by Y. Matsushima et al, Electronics Letters, vol. 23, No. 24, Nov. 19, 1987, pp. 1271–1273.
"AlGaInAs/InP Double Heterostructure Lasers Grown by Low–Pressure Metal Organic Vapor Phase Epitaxy for Emission at 1300 nm.", by Davies et al, Elec. Ltrs., vol. 24, No. 12, Jun. 9, 1988, pp. 732–733.
"Al0.48In0.52As/Ga0.47In0.53As/Al0.48In0.52 As Double–Heterostructure Lasers Grown by Molecular–Beam Epitaxy with Lasing . . . ", by W. T. Tsang, J. Appl. Phys. 52(6), Jun. 1981, pp. 3861–3864.

Primary Examiner—Georgia Epps
Attorney, Agent, or Firm—Hill, Van Santen, Steadman & Simpson

[57] ABSTRACT

A semiconductor laser on an InP substrate having a first confinement layer and a second confinement layer of $(Ga_{0.17}Al_{0.83})_{0.48}In_{0.52}As$ and an active layer in quantum well structure having radiation-generating QW-layers of $Ga_{1-y}In_yAs$.

14 Claims, 1 Drawing Sheet

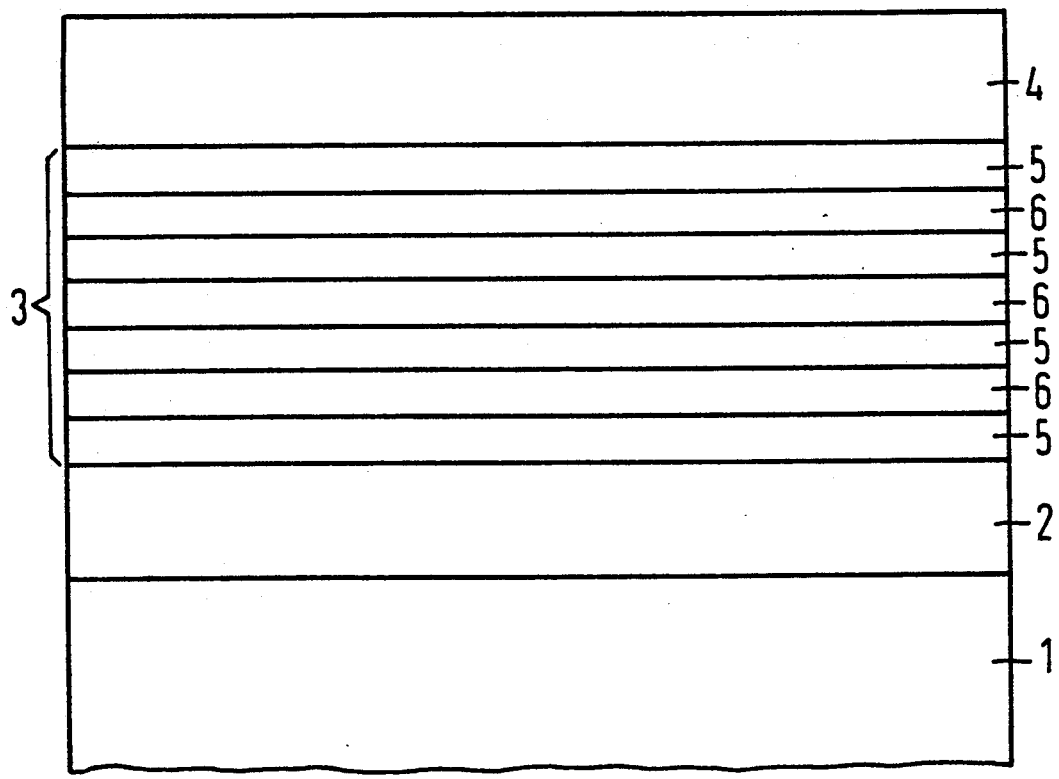

SEMICONDUCTOR LASER IN THE SYSTEM GAALINAS

BACKGROUND OF THE INVENTION

The manufacture of semiconductor lasers for wavelengths between 1.3 and 1.55 μm using materials such as InGaAs/InGaAlAs/InAlAs on an InP substrate is disclosed in the reference by Y. Kawamura et al in Electronics Letters Vol. 20, No. 11, 1984, pages 459–460. In the disclosed structure, an indium phosphide layer and an InAlAs layer are grown as confinement layers on an indium phosphide substrate. A multi-quantum-well structure composed of a succession of InGaAs and InGaAlAs layers is located therebetween. This structure is grown with molecular-beam epitaxy (MBE).

A phosphorous-free, multi-quantum-well structure is disclosed in the reference by Y. Matsushima et al, Electronics Letters Vol. 23, No. 24, 1987, pages 1271–1273. As disclosed a layer sequence of alternating $Ga_{0.47}In_{0.53}As/Al_{0.48}In_{0.52}As$ is thereby grown with molecular-beam epitaxy (MBE).

A reference by J. I. Davies et al, Electronics Letters Vol. 24, No. 12, 1988, pages 732–733 discloses a structure having an active layer of AlGaInAs and confinement layers of InP. This structure is grown and fabricated by metal organic vapor phase epitaxy (MOVPE).

A publication by K. Alavi et al, Applied Physics Letters 42, 1983, pages 254–256 discloses a structure wherein the active layer is GaAlInAs material and the confinement layers are of AlInAs. This structure is produced with MBE.

A publication by W. T. Tsang, in the Journal of Applied Physics 52, 1981, pages 3861–3864, discloses a structure wherein a layer sequence AlInAs/GaInAs/AlInAs/GaInAs is grown on an indium phosphide substrate. The production of this layer sequence is produced by MBE.

Also in a publication by W. T. Tsang et al, in Applied Physics Letters 42, 1981, pages 922–924, a structure is disclosed having an indium phosphide substrate and an active layer of GaAlInAs between indium phosphide confinement layers. This structure is also produced with MBE.

In the Japanese Journal of Applied Physics 27, L1731–L1733, 1988, an article by T. Miyazawa et al discloses a structure wherein a multi-quantum-well structure of InGaAs/InAlAs material was grown on an indium phosphide substrate. Here, too, MBE was utilized in the manufacturing process.

U.S. Pat. No. 4,430,740 issued to T.L. Nuyen discloses a semiconductor laser on InP wherein an active layer of $(Ga_x-Al_{1-x})_{0.47}In_{0.53}As$ is grown between confinement layers of $Ga_zAl_{1-z}As_ySb_{1-y}$ on a substrate of InP.

U.S. Pat. No. 4,599,728 issued to K. Alavi et al discloses a semiconductor laser having a quantum well structure wherein active layers of $Ga_{0.47}In_{0.53}As$ are interrupted by intermediate layers of $Al_{0.48}In_{0.52}As$ and confinement layers of $Al_{0.48}In_{0.52}As$. GaInAs and GaAsSb are cited as further materials for the active layers and AlInAs, InP and AlAsSb are cited as further materials for the intermediate layers.

SUMMARY OF THE INVENTION

An object of the present invention is to provide a layer structure for a semiconductor diode that can be simply manufactured. A favorable radiation yield is simultaneously achieved.

This object is achieved with a semiconductor diode having an active layer of $(Ga_{1-x}Al_x)_{1-y}In_yAs$ wherein $0.04 \leq x \leq 0.3$ and $0.52 \leq y \leq 0.53$, and having a first confinement layer and a second confinement layer of $(Ga_{1-x}Al_x)_{1-y}In_yAs$ wherein $0.48 \leq x \leq 0.95$ and $0.52 \leq y \leq 0.53$.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawings in which:

The single FIGURE shows the layer structure of the present invention.

DESCRIPTION OF THE PREFERRED EMBODIMENT

A first confinement layer 2 is grown on a substrate 1 of InP. Located thereon are the active layer 3 that, in the case of a quantum well structure, is composed of a succession of thin QW-layers 5 for generating radiation and intermediate layers 6 separating these QW-layers 5 and of a second confinement layer 4. The layers provided for generating radiation, i.e. the active layer 3 or particularly QW-layers 5, are composed of $(Ga_{1-x}Al_x)_{1-y}In_yAs$. The aluminum portion indicated by x is the determining factor for the wavelength of the generated radiation. In the case of a quantum well structure, x can be equal to zero since the wavelength of the radiation in the quantum well can also be set by the thickness of the appertaining QW-layers 5.

What is important in the structure of the present invention is that all layers grown onto the substrate 1 contain no phosphorous. The first confinement layer 2 and the second confinement layer 4 are $(Ga_{1-x}Al_x)_{1-y}In_yAs$, whereby the aluminum portion established by x differs from the aluminum portion of the active layer 3. The intermediate layers 6 in the quantum well structure are also $(Ga_{1-x}Al_x)_{1-y}(In_yAs)$, whereby the values of x and y need not be the same as in the confinement layers.

The energy band spacing of the $(Ga_{1-x}Al_x)_{1-y}In_yAs$ is a strictly monotonously increasing, linear function of the aluminum portion x given a constant In. An energy band spacing of 0.744 eV is obtained for GaInAs; the energy band spacing is 1.462 eV for AlInAs. Active layers having an aluminum content of $x=0.04$ through 0.3 thus come into consideration for the wavelengths of 1.3 μm through 1.55 μm used in opto-electronics. The aluminum content $x=0.04$ corresponds to an energy band spacing of 800 meV or to a wavelength of 1.55 μm. An energy band spacing of 953 meV or a wavelength of 1.3 μm corresponds to the aluminum part of $x=0.3$. So that an adequately great discontinuity in refractive index results at the boundaries to the confinement layers 2, 4, the band spacing in the confinement layers 2, 4 must be correspondingly higher than in the active layer 3. Advantageously, this difference in the band spacings amounts to at least 300 meV. With this energy band spacing, an aluminum portion of $x=0.48$ results for the wavelength 1.55 μm or 1.1 eV and an aluminum portion of $x=0.68$ results for the wavelength 1.3 μm or 1.25 eV. An aluminum content of at least 0.68 results for the overall wavelength region utilized and is beneficial for the composition of the quaternary material of the confinement layers 2, 4.

It has been shown that a certain minimum content of gallium in the confinement layers 2, 4 noticeably improves the morphology. The gallium content should amount to at least 0.05. Especially beneficial values result for a composition of the confinement layers 2, 4 composed of $(Ga_{0.17}Al_{0.83})_{0.48}In_{0.52}As$. A value of x in the proximity of 0.83 is to be viewed as optimum for the confinement layers 2, 4 of both a structure having a single active layer as well as having a quantum well structure. The above stated parameters of the confinement layers 2, 4 equally applies to the composition of the intermediate layers 6 in the quantum well structure; the aluminum portion indicated by x, however, can be somewhat lower in the intermediate layers 6 than in the confinement layers 2, 4.

The described layer sequences are grown on InP with normal pressure MOVPE. A horizontal, rectangular quartz cell having vertical gas admission is utilized. The required epitaxy temperatures are reached with a radio-frequency generator. The substrates are heated up to 500° C. under arsenic and hydrogen; the growth also begins at 500° C. A further, rapid heating up to 630° C. follows which is the actual epitaxy temperature at which deposition is carried out until the end. The beginning of the epitaxy must be at 500° C. because the phosphorous evaporates out of the substrate at this temperature, the surface thereof being destroyed.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. In a semiconductor laser on a substrate of InP, having an active layer between a first confinement layer and a second confinement layer, whereby all of the material grown onto the substrate contains no phosphorous as a substitution component and whereby the first confinement layer and the second confinement layer have the same composition, comprising the active layer being $(Ga_{1-x}Al_x)_{1-y}In_yAs$ wherein $0.04 \leq x \leq 0.3$ and $0.52 \leq y \leq 0.53$; and the first confinement layer and the second confinement layer being $(Ga_{1-x}Al_x)_{1-y}In_yAs$ wherein $0.48 \leq x \leq 0.95$ and $0.52 \leq y \leq 0.53$.

2. The semiconductor laser according to claim 1, wherein the active layer has a quantum well structure having at least two QW-layers provided for generating radiation; wherein a respective intermediate layer is present between two respectively successive QW-layers; and wherein the QW-layers are $(Ga_{1-ux}Al_{ux})_{1-uy}In_{uy}As$ and the intermediate layers are $(Ga_{1-x}Al_x)_{1-y}In_yAs$, wherein $0.48 \leq x \leq 0.95$ and $0.52 \leq y \leq 0.53$ and wherein $0.48 \leq ux \leq 0.95$ and $0.52 \leq uy \leq 0.53$.

3. The semiconductor laser according to claim 2, wherein the QW-layers are $Ga_{0.47}In_{0.53}As$.

4. The semiconductor laser according to claim 1, wherein the first confinement layer and the second confinement layer are $(Ga_{0.17}Al_{0.83})_{0.48}In_{0.52}As$.

5. The semiconductor laser according to claim 2, wherein the first confinement layer, the second confinement layer and every intermediate layer are $(Ga_{0.17}Al_{0.83})_{0.48}In_{0.52}As$.

6. In a semiconductor laser on a substrate of InP, having an active layer between a first confinement layer and a second confinement layer, whereby all of the material grown onto the substrate contains no phosphorous as a substitution component and whereby the first confinement layer and the second confinement layer have the same composition, comprising the active layer being $(Ga_{1-x}Al_x)_{1-y}In_yAs$ wherein $0.04 \leq x \leq 0.3$ and $0.52 \leq y \leq 0.53$; and the first confinement layer and the second confinement layer being $(Ga_{1-x}Al_x)_{1-y}In_yAs$ wherein $0.48 \leq x \leq 0.95$ and $0.52 \leq y \leq 0.53$; the active layer having a quantum well structure having at least two QW-layers provided for generating radiation; a respective intermediate layer being present between two respectively successive QW-layers; and the QW-layers being $(Ga_{1-ux}Al_{ux})_{1-uy}In_{uy}As$ and the intermediate layers being $(Ga_{1-x}Al_x)_{1-y}In_yAs$, wherein $0.48 \leq x \leq 0.95$ and $0.52 \leq y \leq 0.53$ and wherein $0.48 \leq ux \leq 0.95$ and $0.52 \leq uy \leq 0.53$.

7. The semiconductor laser according to claim 6, wherein the QW-layers are $Ga_{0.47}In_{0.53}As$.

8. The semiconductor laser according to claim 6, wherein the first confinement layer and the second confinement layer are $(Ga_{0.17}Al_{0.83})_{0.48}In_{0.52}As$.

9. The semiconductor laser according to claim 6, wherein the first confinement layer, the second confinement layer and every intermediate layer are $(Ga_{0.17}Al_{0.83})_{0.48}In_{0.52}As$.

10. In a semiconductor laser on a substrate of InP, having an active layer between a first confinement layer and a second confinement layer, whereby all of the material grown onto the substrate contains no phosphorous as a substitution component and whereby the first confinement layer and the second confinement layer have the same composition, comprising the active layer being $(Ga_{1-x}Al_x)_{1-y}In_yAs$ wherein $0.04 \leq x \leq 0.3$ and $0.52 \leq y \leq 0.53$; and the first confinement layer and the second confinement layer being $(Ga_{1-x}Al_x)_{1-y}In_yAs$ wherein $0.48 \leq x \leq 0.95$ and $0.52 \leq y \leq 0.53$; the active layer having a quantum well structure having at least two QW-layers provided for generating radiation; a respective intermediate layer being present between two respectively successive QW-layers; the QW-layers being $(Ga_{1-x}Al_{ux})_{1-uy}In_{uy}As$ and the intermediate layers being $(Ga_{1-x}Al_x)_{1-y}In_yAs$, wherein $0.48 \leq x \leq 0.95$ and $0.52 \leq y \leq 0.53$ and wherein $0.48 \leq ux \leq 0.95$ and $0.52 \leq uy \leq 0.53$; wherein the QW-layers are $Ga_{0.47}In_{0.53}As$; and the first confinement layer, the second confinement layer and every intermediate layer are $(Ga_{0.17}Al_{0.83})_{0.48}In_{0.52}As$.

11. In a semiconductor laser on a substrate of InP, having an active layer between a first confinement layer and a second confinement layer, whereby all of the material grown onto the substrate contains no phosphorous as a substitution component and whereby the first confinement layer and the second confinement layer have the same composition, comprising the active layer being $(Ga_{1-x}Al_x)_{1-y}In_yAs$ wherein $0.04 \leq x \leq 0.3$ and $0.52 \leq y \leq 0.53$; and the first confinement and the second confinement layer being $(Ga_{0.17}Al_{0.83})_{0.48}In_{0.52}As$.

12. In a semiconductor laser on a substrate of InP, having an active layer between a first confinement layer and a second confinement layer, whereby all of the material grown onto the substrate contains no phosphorous as a substitution component and whereby the first confinement layer and the second confinement layer have the same composition, comprising: the active layer having a quantum well structure having at least two QW-layers provided for generating radiation and a respective intermediate layer between two respectively successive QW-layers, the QW-layers being $(Ga_{1-ux}Al_{ux})_{1-uy}In_{uy}As$, wherein $0.48 \leq ux \leq 0.95$ and $0.52 \leq uy \leq 0.53$; and the first confinement layer, the second confinement layer and every intermediate layer being $(Ga_{0.17}Al_{0.83})_{0.48}In_{0.52}As$.

13. In a semiconductor laser on a substrate of InP, having an active layer between a first confinement layer and a second confinement layer, whereby all of the material grown onto the substrate contains no phosphorous as a substitution component and whereby the first confinement layer and the second confinement layer have the same composition, comprising: the active layer being $(Ga_{1-x}Al_x)_{1-y}In_yAs$ wherein $0.04 \leq x \leq 0.3$ and $0.52 \leq x \leq 0.53$; and the first confinement layer and the second confinement layer being $(Ga_{0.17}Al_{0.83})_{0.48}In_{0.52}As$; the active layer having a quantum well structure having at least two QW-layers provided for generating radiation; a respective intermediate layer being present between two respectively successive QW-layers; and the QW-layers being $(Ga_{1-ux}Al_{ux})_{1-uy}In_{uy}As$ and the intermediate layers being $(Ga_{1-x}Al_x)_{1-y}In_yAs$, wherein $0.48 \leq x \leq 0.95$ and $0.52 \leq y \leq 0.53$ and wherein $0.48 \leq ux \leq 0.95$ and $0.52 \leq uy \leq 0.53$.

14. In a semiconductor laser on a substrate of InP, having an active layer between a first confinement layer and a second confinement layer, whereby all of the material grown onto the substrate contains no phosphorous as a substitution component and whereby the first confinement layer and the second confinement layer have the same composition, comprising: the first confinement layer and the second confinement layer being $(Ga_{0.17}Al_{0.83})_{0.48}In_{0.52}As$; the active layer having a quantum well structure having at least two QW-layers provided for generating radiation; a respective intermediate layer being present between two respectively successive QW-layers; and the QW-layers being $(Ga_{1-ux}Al_{ux})_{1-uy}In_{uy}As$ wherein $0.48 \leq ux \leq 0.95$ and $0.52 \leq uy \leq 0.53$ and every intermediate layer being $(Ga_{0.17}Al_{0.83})_{0.48}In_{0.52}As$.

* * * * *